United States Patent [19]

Rahman et al.

[11] Patent Number: 5,750,632
[45] Date of Patent: May 12, 1998

[54] ISOLATION OF NOVOLAK RESIN BY LOW TEMPERATURE SUB SURFACE FORCED STEAM DISTILLATION

[75] Inventors: M. Dalil Rahman, Flemington; Daniel Aubin, Oxford, both of N.J.

[73] Assignee: Clariant Finance (BVI) Limited, Virgin Islands (Br.)

[21] Appl. No.: 366,634

[22] Filed: Dec. 30, 1994

[51] Int. Cl.$^6$ ................................ C08G 8/04; C08G 14/04
[52] U.S. Cl. ........................ 528/129; 528/137; 528/230; 528/501; 528/503; 430/192; 430/193; 430/270
[58] Field of Search ........................ 528/86, 129, 153, 528/137, 230, 501, 503; 430/192, 193, 270

[56] References Cited

U.S. PATENT DOCUMENTS

| 5,403,696 | 4/1995 | Hioki et al. ........................ 430/192 |
| 5,407,780 | 4/1995 | Hioki et al. ........................ 430/192 |

FOREIGN PATENT DOCUMENTS

| A-0385408 | 9/1990 | European Pat. Off. . |
| A-0529969 | 3/1993 | European Pat. Off. . |

*Primary Examiner*—Duc Truong
*Attorney, Agent, or Firm*—Andrew F. Sayko, Jr.

[57] ABSTRACT

A water insoluble, aqueous alkali soluble novolak resin, process for producing such a novolak resin, a photoresist containing such a novolak resin, and a method for producing a semiconductor device, wherein the resin is isolated by sub surface forced steam distillation.

10 Claims, No Drawings

ISOLATION OF NOVOLAK RESIN BY LOW TEMPERATURE SUB SURFACE FORCED STEAM DISTILLATION

BACKGROUND OF THE INVENTION

The present invention relates to a process for producing water insoluble, aqueous alkali soluble, film forming novolak resins. The present invention also relates to a process for producing light-sensitive compositions useful in positive-working photoresist compositions. Further, the present invention relates to a process for producing substrates coated with these light-sensitive compositions, as well as the process of coating, imaging and developing these light-sensitive mixtures on these substrates.

Photoresist compositions are used in micro-lithography processes for making miniaturized electronic components, such as in the fabrication of computer chips and integrated circuits. Generally, in these processes, a thin coating of a film of a photoresist composition is first applied to a substrate material, such as a silicon wafer used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. The process thereby uncovers a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs). Those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive-working photoresist compositions are currently favored over negative-working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of one micron or less are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to a process for the isolation of a water insoluble, aqueous alkali soluble, film forming novolak resin produced by phenol formaldehyde condensation and isolated using a low temperature (100° C. to 160° C., preferably 105° C. to 150° C., most preferably 110° C. to 140° C.), sub surface, forced steam distillation, to make such film forming novolak resins, and to a process for their use in photoresist compositions. The invention further relates to a process for producing positive-working photoresists containing these water insoluble, aqueous alkali soluble, film forming novolak resins with a photosensitizer, and a process for using such photoresists in producing semi-conductor devices.

The invention provides a process for producing a water insoluble, aqueous alkali soluble, film forming novolak resin obtained by condensing one or more methyl phenols and formaldehyde in presence of an acid catalyst, in a suitable organic reaction solvent or in a mixture of such organic solvents, and isolating the novolak resin using low temperature (100° C. to about 160° C.), sub surface, forced steam distillation.

The invention also provides a process for producing a positive photoresist composition comprising:

a) condensing one or more methyl phenols and formaldehyde in the presence of an acid catalyst in a suitable organic solvent, or in a mixture of organic solvents, and thereby producing a water insoluble, aqueous alkali soluble, film forming novolak resin, and isolating the novolak resin utilizing low temperature, sub surface, forced steam distillation at a temperature of from 100° C. to 160° C.;

b) providing an admixture of: 1) a photosensitive component, in an amount sufficient to uniformly photosensitize the photoresist composition, 2) the novolak resin, such novolak resin being present in the photoresist composition in an amount sufficient to form a substantially uniform photoresist composition, and 3) a suitable photoresist solvent.

The invention further provides a process for producing a semiconductor device by producing a photoresist image on a suitable substrate by coating such a substrate with a positive working photoresist composition which process comprises:

a) condensing one or more methyl phenols and formaldehyde in the presence of an acid catalyst to produce a water insoluble, aqueous alkali soluble novolak, film forming resin, in a suitable reaction solvent or mixture of solvents, and isolating the novolak resin utilizing low temperature, sub surface, forced steam distillation at a temperature of from 100° C. to about 160° C.;

b) providing an admixture of: 1) a photosensitive component, in an amount sufficient to uniformly photosensitize the photoresist composition, 2) the film forming novolak resin, such novolak resin being present in the photoresist composition in an amount sufficient to form a substantially uniform photoresist film, and 3) a suitable solvent; and c) coating the photoresist composition on a suitable substrate; heat treating the coated substrate until substantially all of the solvent is removed; image-wise exposing the photoresist composition; and removing the image-wise exposed areas of such composition with an aqueous alkaline developer.

Optionally one may perform a baking of the substrate either immediately before or after the removing step.

DETAILED DESCRIPTION OF THE PREFERRED EMBODIMENT

Novolak resins have been commonly used in the art of photoresist manufacture as exemplified by "Chemistry and Application of Phenolic Resins", Knop A. And Scheib, W.; Springer Verlag, New York, 1979 in Chapter 4. Similarly, o-quinone diazides are well known to the skilled artisan as demonstrated by "Light Sensitive Systems", Kosar, J.; John Wiley & Sons, New York, 1965 Chapter 7.4. Generally, novolak resins are isolated by initial atmospheric distillation followed by vacuum distillation at high temperature, such as 220°–230° C. at 20–30 mm pressure.

During this distillation, the structure of novolak resin changes and so does it's performance. However, according to the present invention, the use of film forming novolak resins obtained by low temperature, subsurface, forced steam distillation, as opposed to those taught in the prior art, produces a photoresist having higher chemical stability, substantially consistent molecular weight and good performance. At a temperature above 160° C., such novolak resins undergo chemical change and may start to substantially decompose. At a temperature of 140° C. or less such chemical is virtually nonexistent. Without the use of such subsurface, forced steam distillation, such stable novolak resins cannot be isolated at temperatures as low as 160° C. or less. Such contaminants as unreacted methyl phenols cannot be effectively removed.

The particular film forming novolak resins of the present invention are water insoluble, aqueous alkali soluble resins obtained by condensing one or more methyl phenols and formaldehyde in presence of an acid catalyst in a suitable organic solvent or mixture of solvents and isolating the novolak resin by sub surface forced steam distillation at a temperature lower than about 160° C., preferably from about 95° C. to 150° C., most preferably from about 100° C. to 140° C.

The resulting stable water insoluble, aqueous alkali soluble, film forming novolak resin has a substantially consistent molecular weight, preferably in the range of from about 3000 to about 8000 and most preferably from about 4000 to about 5000.

The sensitizer which comprises the photosensitive component of the photoresist composition of the present invention may be an ester of a multihydroxy phenolic or alcoholic compound, preferably a trihydroxyphenylethane or hydroxybenzophenone, and a sulfonic acid or sulfonic acid derivative, such as a 2,1,4- or 2,1,5- sulfonyl chloride, as described in U.S. Pat. Nos. 3,106,465 and 4,719,167, which are incorporated herein by reference.

The photoresist composition is formed by blending the ingredients in a suitable solvent. In a preferred embodiment, the amount of novolak resin in the photoresist composition preferably ranges from about 60% to about 90% and more preferably from about 75% to about 85%, based on the weight of the solid; i.e., non-solvent photoresist components. In a preferred embodiment, the photosensitizer is present in the photoresist composition in an amount of from about 10% to about 30%, preferably from about 15% to about 25%, based on the weight of the solid photoresist components.

In producing the photoresist composition, the novolak resin and photosensitizer are mixed with a suitable solvent, such as propylene glycol monoalkyl ether, propylene glycol alkyl ether acetate, butyl acetate, xylene, ethylene glycol monoethyl ether acetate, propylene glycol monomethyl ether acetate, ("PGMEA"), 2-heptanone, ethyl lactate, ethyl-3-ethoxypropionate, or mixtures thereof.

Other optional ingredients such as colorants, dyes, anti-striation agents, leveling agents, plasticizers, adhesion promoters, speed enhancers, solvents and such surfactants as non-ionic surfactants may be added to the solution of novolak resin, sensitizer and solvent before the solution is coated onto a substrate. Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of resin and sensitizer. Plasticizers which may be used include, for example, phosphoric acid tri-(beta-chloroethyl)-ester; stearic acid; dicamphor; poly-propylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyltrichlorosilane; and gamma-amino-propyl triethoxysilane up to about a 4 percent weight level, based on the combined weight of resin and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The coating solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of resin and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/ aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

264.80 grams of a cresols mixture (m-cresol/3.5 xylenol; 6.3/3.0) was placed in a four necked flask equipped with a condenser, a thermometer, and a dropping funnel. 34.80 grams of additional m-cresol was added. 2.25 grams of maleic anhydride and 200 grams of PGMEA were added and the flask was heated to 95° C. 157.64 g of formaldehyde (molar ratio of cresols/formaldehyde 1.0/0.73) was added dropwise over a period of 90 minutes. The reaction was allowed to continue for 6 hours at 95° C. The unreacted raw materials were distilled off by sub surface forced steam distillation at a temperature of 100°–140° C. High force steam was generated in a separate flask and was allowed to pass to the sub surface of the reaction mixture and the distillate was collected in a flask. The steam distillation was continued for 1.5 hours. More PGMEA (250 gm) was added to keep the stirrer going. The resin was isolated in PGMEA by adding electronic grade PGMEA and was then distilled under vacuum at a temperature of 150° C. and 50 mm pressure to remove trace amounts of water. The relative molecular weight (RMW), GPC molecular weight (MW), and the residual cresol content were determined and the results are shown in Table 1 below.

EXAMPLE 2

Example 1 was repeated using ethyl lactate as the solvent. The results are shown in Table 1 below.

EXAMPLE 3

Example 2 was repeated, except that the molar ratio of cresols/formaldehyde was 1.0/0.74 and the results are shown in Table 1 below.

EXAMPLE 4

Example 1 was repeated in the solvent 3-methoxy-3-methyl butanol (MMB) with a molar ratio of cresols/ formaldehyde of 1.0/0.735) and the results are shown in Table 1 below.

EXAMPLE 5

Example 4 was repeated using isopropyl acetate as the solvent. The results are shown in Table 1 below.

TABLE 1

| Example | RMW | GPC MW | % m-cresol | % 3,5-Xylenol | Tg (°F.) |
|---|---|---|---|---|---|
| 1 | 10.8 | 4230 | 0.32 | 0.24 | 100 |
| 2 | 7.5 | 2444 | 0.8 | 0.1 | — |
| 3 | 9.5 | 4172 | 0.1 | 0.2 | 100 |
| 4 | 8.8 | 3952 | 0.7 | 0.1 | — |
| 5 | 8.5 | 3066 | 0.35 | 0.33 | — |

EXAMPLE 6

A 50 gram photoresist test sample was prepared according to the following formulation:

1) 2.52 gm of a mixed ester of trihydroxyphenylethane with 2,1,4 - and 2,1,5 -diazonaphthoquihone sulfonyl chloride (RI-292 sold by Hoechst Celanese Corp.)
2) 11.48 gm of the resin of Example 1.
3) 36.0 gm PGMEA solvent
4) 0.13 gm of a 10% FC-430 (a fluoroaliphatic polymeric ester available from the 3M Co.) PGMEA solution.

A 50 gm reference photoresist sample was prepared according to a substantially identical procedure with standard water insoluble, aqueous alkali soluble, film forming p-cresol/formaldehyde novolak resin available from Hoechst Celanese Corp.

The photoresist test sample was coated onto an Hexamethyldisiloxane (HMDS) primed silicon wafer to a 1.29 micrometer (µm) thickness. The wafer was soft baked at 110° C. for 60 seconds on an SVG-8100 I-line hot plate. The reference photoresist sample was also coated on an HMDS primed silicon wafer to 1.29 mm thickness, using the same procedure.

The exposure matrix was printed on the coated wafers using a 0.54NA NIKON® i-line stepper and a NIKON® resolution reticle. The exposed wafers were post exposure baked (PEB) at 110° C. for 60 seconds on the i-line hot plate. The wafers were then developed using AZ® 300-MIF (metal ion free) tetramethylammonium hydroxide (TMAH) developer. The developed wafers were examined using a HITACHI® S-400 scanning electron microscope (SEM). A nominal dose (Dose to Print, i.e. DTP) was measured at the best focus, the dose required to precisely replicate a given feature. DTP, resolution and focus latitude were measured and are shown in Table 2 below.

EXAMPLE 7

Example 6 was repeated with the resin from example 3, according to the procedure of example 6 and the results are shown in Table 2 below.

EXAMPLE 8

Example 6 was repeated with the resin from example 4, according to the procedure of example 6 and the results are shown in Table 2 below.

EXAMPLE 9

Example 6 was repeated with the resin from example 5, according to the procedure of example 6 and the results are shown in Table 2 below.

TABLE 2

| Example | RMW | DTC (mJ/cm²) | DTP (mJ/cm²) | Resolution (µm) | DOF (.4 µm 1/s) |
|---|---|---|---|---|---|
| 6 | 10.8 | 126 | 225 | 0.35 | −0.2/0.4 |
| 7 | 9.5 | 220 | 370 | 0.35 | 0/0.6 |
| 8 | 8.8 | 80 | 145 | 0.40 | −0.4/0.2 |
| 9 | 8.5 | 70 | 130 | 0.35 | −0.6/0.4 |

Solution Viscosity—Relative Molecular Weight (RMW) Procedure:

The viscosity solution was prepared by dissolving 7 grams of the novolak resin in a 100 ml. volumetric flask. using cyclohexanone solvent. The solution was filtered using a 5 micrometer (micron) pressure syringe filter. The viscosity was measured using a Cannon-Fenske #200 viscometer at 25° C. The relative molecular weight (RMW) was determined using the following equation:

$$RMW = \log \left( \frac{\text{Time of Flow for Resin Solution}}{\text{Time of Flow for Solvent}} / 0.07 \right)^2$$

Molecular Weight (Mw and Mn) Procedure:

The molecular weight of the polymers, whether weight average molecular weight Mw, or number average molecular weight Mn, were measured by gel permeation chromatography (GPC) performed on dilute solutions of the polymer in tetrahydrofuran (THF). The actual apparatus employed consisted of a Waters® (Millipore Corp.) programmable automatic sampler, vacuum pump, chromatography columns with heater, and a differential refractometer connected to a Shimadzu® CR 30A data reduction system with accompanying software (version 1.1, Shimadzu part No. T/N 22301309-91). The refractometer used was a Waters model 410 and four chromatography columns, 500 Angstrom, 1000 Angstrom, 10,000 Angstrom and 100,000 Angstrom (available from Waters Corp.) were connected in series. The system was calibrated using multiple available polystyrene standards ranging in molecular weight as follows:

| GPC CALIBRATION | |
|---|---|
| Calibration Standard (Polystyrene) | Mol. Wt. |
| 1 | 470,000 |
| 2 | 170,000 |
| 3 | 68,000 |
| 4 | 34,500 |
| 5 | 9,200 |
| 6 | 3,200 |
| 7 | 1,250 |

The standards are essentially monodisperse, consisting substantially of a single molecular weight. With the system thus calibrated, the weight average molecular weight Mw, the number average molecular weight Mn, and polydispersity, Mw/Mn, were obtained for polymers produced in accordance with the Examples.

Glass Transition Temperature (Tg) Procedure:

Glass transition temperatures (Tg) were determined by differential scanning calorimetry using a Perkin first inflection of the heating curve of the polymer.Elmer® DSC-4 calorimeter operating at 20° C./minute, nitrogen atmosphere at 60 cc/minute. Glass transition temperature by this method is generally defined as the point of intersection of tangent lines about the point of first inflection of the heating curve of the polymer.

We claim:

1. A process for producing a water insoluble, aqueous alkali soluble novolak resin comprising condensing one or more methyl phenols and an aldehyde, in the presence of an acid catalyst, in a suitable organic reaction solvent, distilling said novolak resin utilizing forced steam distillation, at a temperature of 100° C. to 160° C. and thereby isolating said novolak resin.

2. The process of claim 1 wherein the forced steam distillation is carried out at a temperature of from 100° C. to 150° C.

3. The process of claim 1 wherein the forced steam distillation is carried out at a temperature of from 110° C. to 140° C.

4. The process of claim 1 wherein the methyl phenols comprise one or more of paracresol, meta-cresol, 3,5-xylenol, 2,5-xylenol, 2,3,5-xylenol, 2,3,4-xylenol, 2,4,6-xylenol and 3,4,5-xylenol.

5. The process of claim 1 wherein the aldehyde comprises a 20 to 50 weight percent aquous solution.

6. The process of claim 1 wherein the aldehyde comprises a 25 to 45 weight percent aqueous solution.

7. The process of claim 1 wherein the aldehyde is formaldehyde, trioxane, benzaldehyde or hydroxybenzaldehyde.

8. The process of claim 1 wherein the acid catalyst comprises one or more of oxalic acid, maleic anhydride, maleic acid, fumeric acid, or acetic acid.

9. The process of claim 1 wherein the organic solvent comprises one or more of propylene glycol methyl ether acetate, methoxymethylbutanol, or n-butyl acetate.

10. The process of claim 1 wherein the steam is produced from deionized water.

* * * * *